United States Patent
Sekido et al.

(10) Patent No.: US 9,583,416 B2
(45) Date of Patent: Feb. 28, 2017

(54) MOUNTING STRUCTURE OF SEMICONDUCTOR DEVICE AND METHOD OF MANUFACTURING THE SAME

(71) Applicant: OLYMPUS CORPORATION, Tokyo (JP)

(72) Inventors: Takanori Sekido, Machida (JP); Masato Mikami, Hachioji (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/058,671

(22) Filed: Mar. 2, 2016

(65) Prior Publication Data

US 2016/0181229 A1 Jun. 23, 2016

Related U.S. Application Data

(62) Division of application No. 13/932,333, filed on Jul. 1, 2013.

(30) Foreign Application Priority Data

Jul. 17, 2012 (JP) ................................. 2012-158807

(51) Int. Cl.
*H01L 23/00* (2006.01)
*H01L 23/48* (2006.01)
(Continued)

(52) U.S. Cl.
CPC .............. *H01L 23/48* (2013.01); *H01L 21/56* (2013.01); *H01L 23/24* (2013.01);
(Continued)

(58) Field of Classification Search
CPC .................................................... H01L 23/48
See application file for complete search history.

(56) References Cited

U.S. PATENT DOCUMENTS 5,963,427 A 10/1999 Bollesen
2003/0197283 A1 10/2003 Choi

FOREIGN PATENT DOCUMENTS

JP H06-120285 A 4/1994
JP H08-335663 A 12/1996
(Continued)

OTHER PUBLICATIONS

U.S. Office Action dated Nov. 5, 2015 issued in U.S. Appl. No. 13/932,333.
(Continued)

*Primary Examiner* — William Harriston
(74) *Attorney, Agent, or Firm* — Scully, Scott, Murphy & Presser, P.C.

(57) ABSTRACT

A semiconductor-device mounting structure includes a first semiconductor device and a plate-shaped second semiconductor device connected to the first semiconductor device. The first semiconductor device includes a flexible board, an electronic component, and a sealing resin. The flexible board includes a bendable flexible portion and a hard portion. The flexible portion is bent at a boundary with the hard portion, along a shape of the electronic component such that the flexible board covers the electronic component. The flexible board and the electronic component are sealed with the sealing resin. The first semiconductor device is provided vertical to the second semiconductor device such that the hard portion is provided parallel to the second semiconductor device, and a length of the hard portion in a direction perpendicular to a bend line of the flexible portion is equal to a thickness of a bottom surface of the electronic component in the direction.

5 Claims, 13 Drawing Sheets

(51) Int. Cl.
  *H01L 21/56* (2006.01)
  *H01L 23/24* (2006.01)
  *H01L 23/31* (2006.01)
  *H01L 23/498* (2006.01)
  *H01L 25/065* (2006.01)
  *H01L 23/544* (2006.01)

(52) U.S. Cl.
  CPC ...... *H01L 23/3107* (2013.01); *H01L 23/3135* (2013.01); *H01L 23/3157* (2013.01); *H01L 23/3185* (2013.01); *H01L 23/4985* (2013.01); *H01L 25/0652* (2013.01); *H01L 25/0657* (2013.01); *H01L 23/544* (2013.01); *H01L 24/16* (2013.01); *H01L 24/81* (2013.01); *H01L 2224/0401* (2013.01); *H01L 2224/05099* (2013.01); *H01L 2224/05599* (2013.01); *H01L 2224/1134* (2013.01); *H01L 2224/131* (2013.01); *H01L 2224/13144* (2013.01); *H01L 2224/16225* (2013.01); *H01L 2224/16238* (2013.01); *H01L 2224/26145* (2013.01); *H01L 2224/2929* (2013.01); *H01L 2224/32225* (2013.01); *H01L 2224/73204* (2013.01); *H01L 2224/73253* (2013.01); *H01L 2224/8113* (2013.01); *H01L 2224/81132* (2013.01); *H01L 2224/81139* (2013.01); *H01L 2224/81191* (2013.01); *H01L 2224/81815* (2013.01); *H01L 2224/8313* (2013.01); *H01L 2224/83132* (2013.01); *H01L 2224/83191* (2013.01); *H01L 2224/83862* (2013.01); *H01L 2224/83874* (2013.01); *H01L 2224/92125* (2013.01); *H01L 2224/92225* (2013.01); *H01L 2225/06517* (2013.01); *H01L 2225/06562* (2013.01); *H01L 2225/06572* (2013.01); *H01L 2225/06582* (2013.01); *H01L 2225/06593* (2013.01); *H01L 2924/15311* (2013.01); *H01L 2924/19041* (2013.01); *H01L 2924/19105* (2013.01)

(56) References Cited

FOREIGN PATENT DOCUMENTS

| | | |
|---|---|---|
| JP | H11-111772 A | 4/1999 |
| JP | 2001-077284 A | 3/2001 |
| JP | 2001-077294 A | 3/2001 |
| JP | 2001-203319 A | 7/2001 |
| JP | 2007-251225 A | 9/2007 |

OTHER PUBLICATIONS

Japanese Office Action dated May 10, 2016 in related Japanese Patent Application No. 2012-158807, together with an English language translation.

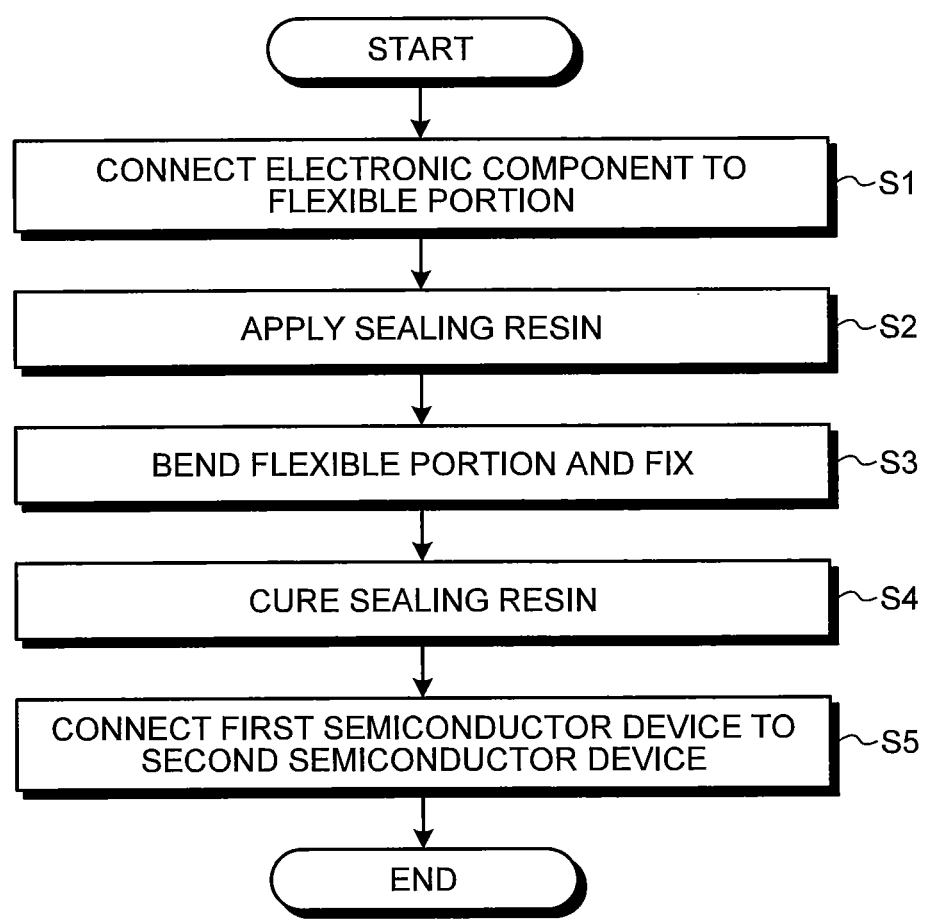

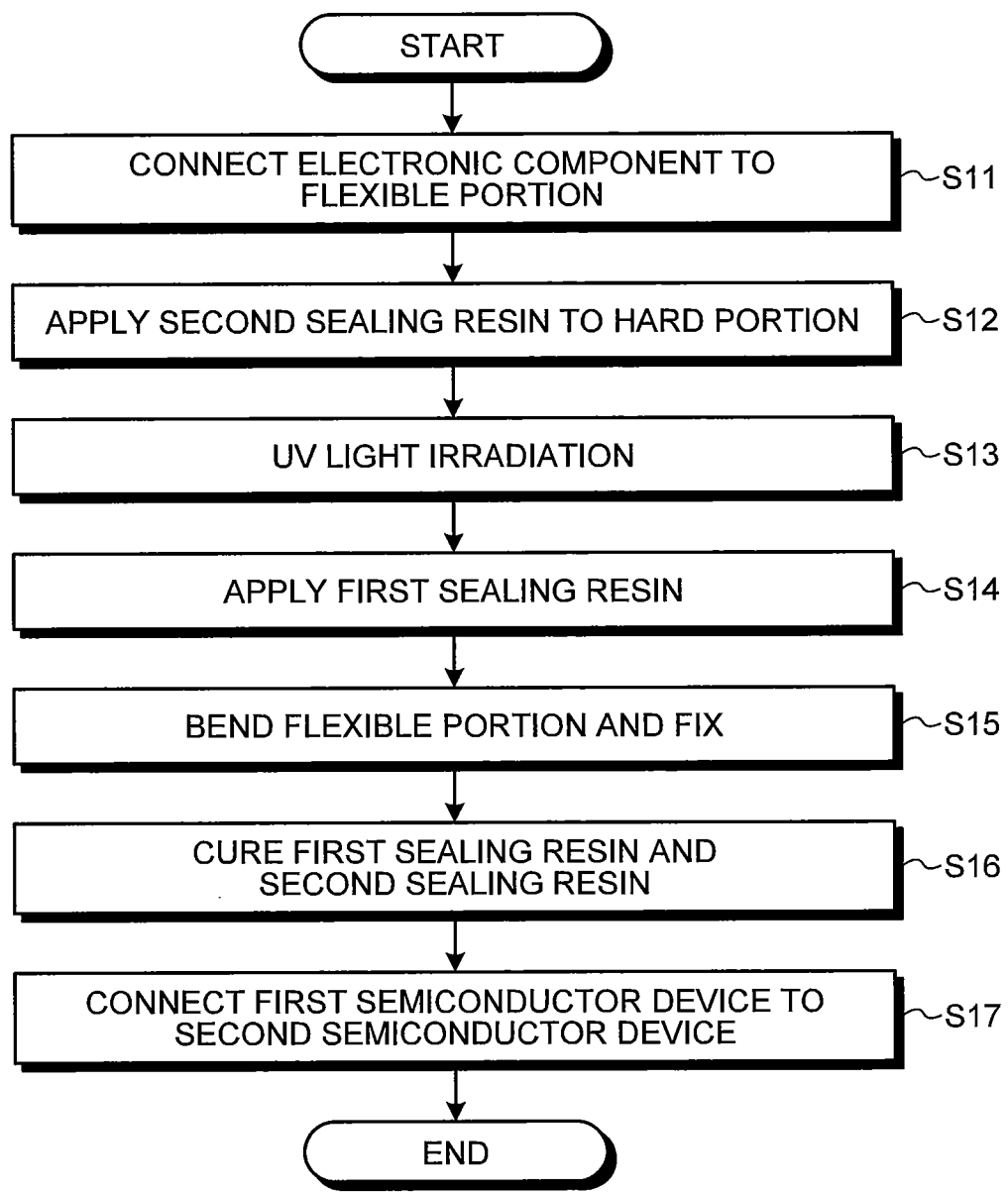

MOUNTING STRUCTURE OF SEMICONDUCTOR DEVICE AND METHOD OF MANUFACTURING THE SAME

CROSS-REFERENCE OF RELATED APPLICATIONS

This application is a Divisional Application of U.S. patent application Ser. No. 13/932,333, filed on Jul. 1, 2013, which is based upon and claims the benefit of priority from Japanese Patent Application No. 2012-158807, filed on Jul. 17, 2012, the entire contents of each of which are incorporated herein by reference.

BACKGROUND

1. Technical Field

The disclosure relates to a mounting structure of a semiconductor device and a method of manufacturing the same.

2. Related Art

In recent years, medical and industrial endoscopes have been widely used. In an exemplary medical endoscope, an image pickup device such as a CCD is built in a distal end of a body insertion portion. Lesions can be observed by deeply inserting the insertion portion into the body, and testing and treatment of the body can be performed by using together with a treatment instrument as needed. In the endoscope, there is a need to achieve a small-sized distal hard portion in which a semiconductor device is built.

In order to achieve a compact semiconductor device, various methods of mounting electronic components have been proposed. For example, there is disclosed a semiconductor device where a flexible board has an electrode on one surface and an external electrode on the other surface. The flexible board is bent to cover a plurality of electronic components, and after an inner portion thereof is sealed with a resin, the flexible board is mounted so as to be parallel to a motherboard (see, for example, Japanese Laid-open Patent Publication No. 2001-077294).

SUMMARY

In accordance with some embodiments, a mounting structure of a semiconductor device and a method of manufacturing the same are presented.

In some embodiments, a semiconductor-device mounting structure includes a first semiconductor device and a plate-shaped second semiconductor device connected to the first semiconductor device. The first semiconductor device includes a flexible board, an electronic component, and a sealing resin. The flexible board includes a bendable flexible portion and a hard portion. The flexible portion is bent at a boundary with the hard portion, along a shape of the electronic component such that the flexible board covers the electronic component. The flexible board and the electronic component are sealed with the sealing resin. The first semiconductor device is mounted vertical to the second semiconductor device such that the hard portion is parallel to the second semiconductor device.

In some embodiments, a method of manufacturing a semiconductor-device mounting structure including a first semiconductor device and a plate-shaped second semiconductor device is presented. The first semiconductor device includes a flexible board, an electronic component, and a sealing resin. The flexible board includes a bendable flexible portion and a hard portion. The method includes: connecting the electronic component to the flexible portion with solder by using a reflow method; applying the sealing resin to an entire surface of the flexible board and a lower portion of the electronic component; bending the flexible portion along a shape of the electronic component such that the flexible board covers the electronic component, and then preliminarily fixing the first semiconductor device with a jig; heating the preliminarily-fixed first semiconductor device in a furnace to cure the sealing resin; and mounting the cured first semiconductor device vertical to the second semiconductor device such that the hard portion is parallel to the second semiconductor device, and connecting the first semiconductor device to the second semiconductor device.

In some embodiments, a method of manufacturing a semiconductor-device mounting structure including a first semiconductor device and a plate-shaped second semiconductor device is presented. The first semiconductor device includes a flexible board, an electronic component, and a first sealing resin. The flexible board includes a bendable flexible portion and a hard portion. The method includes: connecting the electronic component to the flexible portion; applying a second sealing resin, which is softer than the first sealing resin that is a UV-curable thermosetting resin, to the hard portion; after applying the second sealing resin, irradiating the second sealing resin with UV light to enter into a B stage state; applying the first sealing resin to the flexible portion and a lower portion of the electronic component; bending the flexible portion along a shape of the electronic component such that the flexible board covers the electronic component, and preliminarily fixing the first semiconductor device with a jig; heating the preliminarily-fixed first semiconductor device in a furnace to cure the first sealing resin and the second sealing resin; and mounting the cured first semiconductor device vertical to the second semiconductor device such that the hard portion is parallel to the second semiconductor device, and electrically connecting the electronic component to the second semiconductor device.

The above and other features, advantages and technical and industrial significance of this invention will be better understood by reading the following detailed description of presently preferred embodiments of the invention, when considered in connection with the accompanying drawings.

BRIEF DESCRIPTION OF DRAWINGS

FIG. 3 is a flowchart for describing the manufacturing process of the semiconductor-device mounting structure according to the first embodiment of the present invention;

FIG. 5 is a flowchart for describing a manufacturing process of the semiconductor-device mounting structure according to the second embodiment of the present invention;

DETAILED DESCRIPTION

Figure 1:
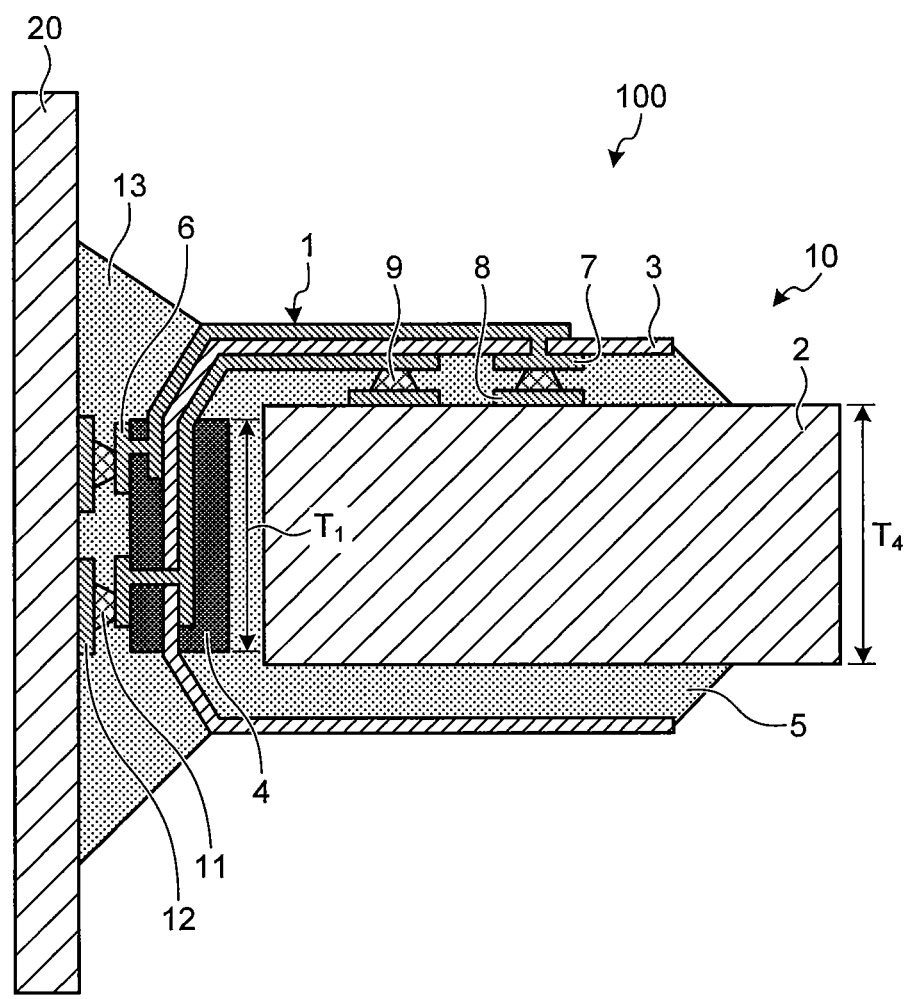
FIG. 1 is a schematic cross-sectional view of a semiconductor-device mounting structure according to a first embodiment of the present invention.

Exemplary embodiments will be described with reference to the accompanying drawings. The present invention is not limited to the embodiments. In the drawings, the same elements are denoted by the same reference numerals. In addition, it should be noted that the drawings are schematic, and the relation between thickness and width of each element, the ratio of each element, and the like are different from real ones. Among figures in the drawings, portions having different dimensional relations or ratios are included.

FIG. 1 is a schematic cross-sectional view of a semiconductor-device mounting structure according to the first embodiment of the present invention. A semiconductor-device mounting structure 100 according to the first embodiment includes a first semiconductor device 10 and a plate-shaped second semiconductor device 20.

In the first semiconductor device 10, a flexible board 1 is arranged to cover an electronic component 2, and the flexible board 1 and the electronic component 2 are adhered to each other with a sealing resin 5. The flexible board 1 includes a flexible portion 3 and a hard portion 4 which is formed substantially on the central portion of the flexible portion 3. The hard portion 4 of the flexible board 1 may be formed by attaching a reinforcement plate to the flexible portion 3. Alternatively, the flexible board 1 may be configured by using a commercially-available rigid flexible board. In addition, in the specification, the electronic component 2 and the second semiconductor device 20 denote semiconductor chips, semiconductor package parts, and printed wire boards. However, the electronic component 2 and the second semiconductor device 20 may be a structure part such as a case.

On the flexible portion 3, an electrode 7 is formed on the side where the electronic component 2 is mounted. The electrode 7 is configured to be connected to the electronic component 2. On the hard portion 4, an external electrode 6 is formed on the side where the second semiconductor device 20 is mounted. The external electrode 6 is configured to be connected to the second semiconductor device 20. Preferably, a length $T_1$ of the hard portion 4 is substantially equal to a thickness $T_4$ of a bottom surface of the electronic component 2. Assuming that the length $T_1$ of the hard portion 4 is substantially equal to the thickness $T_4$ of the bottom surface of the electronic component 2, and the flexible portion 3 is bent at the boundary with the hard portion 4, the flexible portion 3 can be bent along a shape of the electronic component 2. In the specification, assuming that the electronic component 2 is a rectangular body, the bottom surface of the electronic component 2 denotes a plane of minimum area.

The electronic component 2 includes an electrode 8 on the side surface of thereof to be connected to the flexible board 1. The electrode 8 is connected to the electrode 7 on the flexible board 1 with a conductive member 9 such as solder. A gap between the flexible board 1 and the electronic component 2 is sealed with a sealing resin 5. The sealing resin 5 is formed of a thermosetting resin.

An electrode 12 is formed on the second semiconductor device 20 and is connected to the first semiconductor device 10, that is, to the electronic component 2 via a conductive member 11 such as Au stud bump or solder. A connection portion between the first semiconductor device 10 and the second semiconductor device 20 is sealed with a sealing resin 13. In connection between the first semiconductor device 10 and the second semiconductor device 20, the first semiconductor device 10 is provided vertical to the second semiconductor device 20 such that the surface of the hard portion 4 is parallel to the second semiconductor device 20. The first semiconductor device 10 is vertically mounted through the bottom surface thereof having the minimum area, so that packaging density can be improved.

If the electronic component 2 is covered with the flexible board 1 having only the flexible portion 3 without the hard portion 4, the flexible board 1 is formed in an arc shape at the bottom surface of the electronic component 2. In this situation, if the first semiconductor device 10 is mounted vertical to the second semiconductor device 20, stress is concentrated at a connecting portion between the flexible board 1 and the conductive member 11, which may lead to detachment of the connecting portion under severe environment such as high humidity. In contrast, since the hard portion 4 is employed in the first embodiment, no stress-concentrated point occurs. Therefore, even under severe environment, it is possible to secure reliability of connection of the semiconductor-device mounting structure 100.

Next, a method of manufacturing the semiconductor-device mounting structure 100 according to the embodiment will be described with reference to FIGS. 2A to 2D and FIG. 3. FIGS. 2A to 2D are schematic views for describing a manufacturing process of the semiconductor-device mounting structure 100 according to the first embodiment of the present invention. FIG. 3 is a flowchart for describing the manufacturing process of the semiconductor-device mounting structure according to the first embodiment of the present invention. In FIGS. 2A to 2D, electrodes are not illustrated.

Figure 2A:
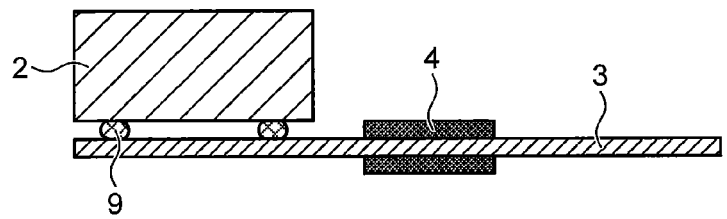
FIGS. 2A to 2D are schematic views for describing a manufacturing process of the semiconductor-device mounting structure according to the first embodiment of the present invention.

First, as illustrated in FIG. 2A, the electronic component 2 is connected to the flexible board 1 (Step S1: electronic component connection process). The electronic component 2 is connected on the flexible portion 3 with a conductive member 9 such as solder. Preferably, the solder connection is performed by using a reflow method.

Figure 2B:
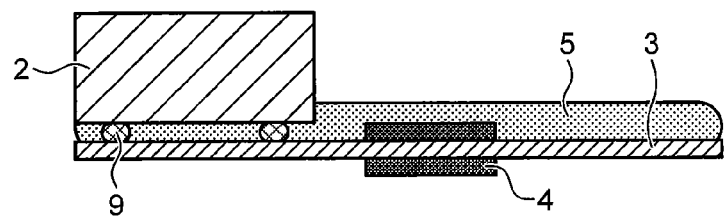

After the electronic component connection process, as illustrated in FIG. 2B, the sealing resin 5 is applied to the entire surface of the flexible board 1 as well as to a lower portion of the electronic component 2 (Step S2: application process). The sealing resin 5 is filled into the lower portion of the electronic component 2 through capillary phenomenon.

Figure 2C:
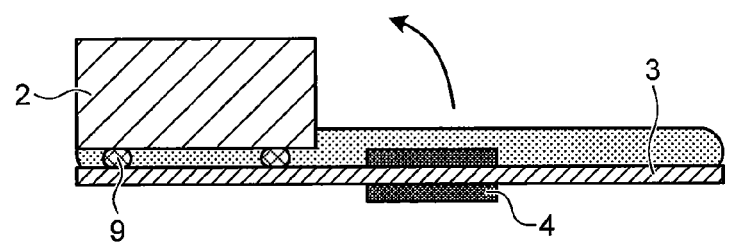
Figure 2D:
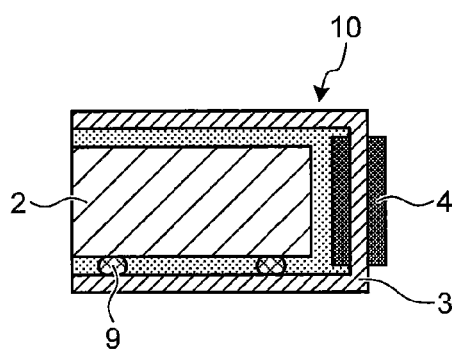

As illustrated in FIG. 2C, the flexible portion 3 is bent in the direction indicated by the arrow in the figure. As illustrated in FIG. 2D, the electronic component 2 is covered with the flexible portion 3, and the shape of first semiconductor device 10 is preliminarily fixed by a jig or the like (Step S3: bending process).

Subsequently, the preliminarily-fixed first semiconductor device 10 is heated in a furnace to cure the sealing resin 5 (Step S4: curing process).

The first semiconductor device 10 which is sealed by curing the sealing resin 5 is provided vertical to the second semiconductor device 20 such that the hard portion 4 is parallel to the second semiconductor device 20, and the first semiconductor device 10 is connected to the second semiconductor device 20, so that the semiconductor-device mounting structure 100 is manufactured (Step S5: connection process).

According to the semiconductor-device mounting structure 100 of the first embodiment, since the hard portion 4 is formed at a connecting portion between the first semiconductor device 10 and the second semiconductor device 20, even when the flexible board 1 is bent along the shape of the electronic component 2, the flexible board 1 is not formed in an arc shape, and thus it is possible to prevent defective connection. In addition, since the first semiconductor device 10 is vertically connected to the second semiconductor device 20, it is possible to improve the packaging density.

In the first embodiment, although a thermosetting resin is used as the sealing resin 5, a UV-curable thermosetting resin may be used. If the UV-curable thermosetting resin is employed, after the sealing resin 5 is applied to the flexible board 1, the resin may be irradiated with UV light to enter into a half-cured state; and then, the flexible portion 3 may be bent along the shape of the electronic component 2 and preliminarily fixed; and heating and curing may be performed. Due to the use of the UV-curable thermosetting resin, it is possible to reduce heat damage to the electronic component 2 and the like.

Figure 4:
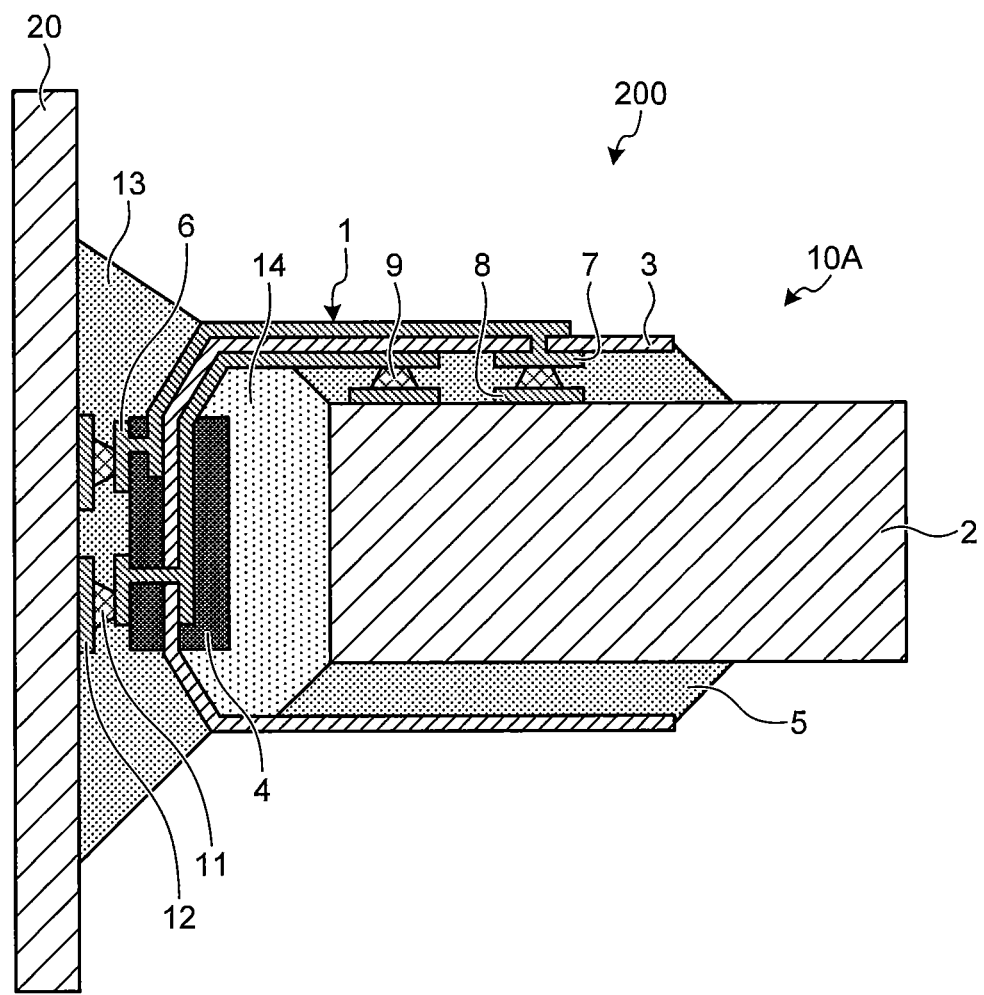
FIG. 4 is a schematic cross-sectional view of a semiconductor-device mounting structure according to a second embodiment of the present invention.

A semiconductor-device mounting structure 200 according to a second embodiment is different from the semiconductor-device mounting structure 100 of the first embodiment in that a second sealing resin is used to seal a gap between a bottom surface of an electronic component and a hard portion. The semiconductor-device mounting structure 200 according to the second embodiment will be described with reference to FIG. 4. FIG. 4 is a cross-sectional view of the semiconductor-device mounting structure 200 according to the second embodiment of the present invention.

As illustrated in FIG. 4, in a first semiconductor device 10A, a second sealing resin 14 seals a gap between a bottom surface of an electronic component 2, a hard portion 4 and a flexible portion 3 in the vicinity of the hard portion 4. In addition, a sealing resin 5 as a first sealing resin seals a gap between a side surface of the electronic component 2 and the flexible portion 3. Preferably, the first sealing resin 5 and the second sealing resin 14 are adhered to each other.

Preferably, the second sealing resin 14 is softer than the first sealing resin 5. Since the second sealing resin 14 is made of a soft material, when an external force is exerted to the first semiconductor device 10A, stress is absorbed by the second sealing resin 14 as a soft material. Therefore, it is possible to prevent the first sealing resin 5 from being peeled off from the first semiconductor device 10A as well as to prevent the first semiconductor device 10A from being detached from the second semiconductor device 20. In addition, since the vicinity of the hard portion 4 is also sealed with the second sealing resin 14, it is possible to prevent the flexible portion 3 from being detached from the hard portion 4.

A material having smaller after-curing hardness than the sealing resin may be used as the second sealing resin 14. For example, in the case where an epoxy resin is used as the sealing resin, a urethane resin, a silicon resin, or the like may be used. In addition, preferably, a UV-curable thermosetting resin is used as the second sealing resin 14. In the specification, a UV-curable thermosetting resin refers to a resin which can be cured in a B-stage state, that is, a half-cured state having plasticity and adhesiveness through UV light irradiation and can be completely cured by heating.

Next, a method of manufacturing the semiconductor-device mounting structure 200 according to the embodiment will be described with reference to FIG. 5 and FIGS. 6A to 6D. FIG. 5 is a flowchart for describing a manufacturing process of the semiconductor-device mounting structure 200 according to the second embodiment of the present invention. FIGS. 6A to 6D are schematic views for describing the manufacturing process of the semiconductor-device mounting structure according to the second embodiment of the present invention. In FIGS. 6A to 6D, electrodes are not illustrated.

Figure 6A:
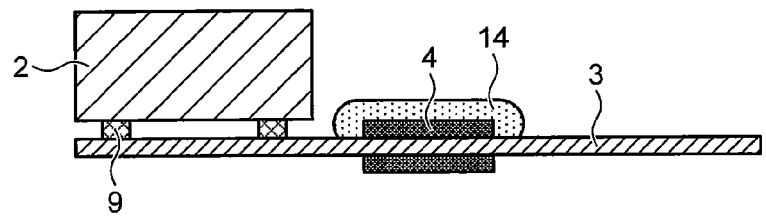
FIGS. 6A to 6D are schematic views for describing the manufacturing process of the semiconductor-device mounting structure according to the second embodiment of the present invention.

First, as illustrated in FIG. 6A, the electronic component 2 is connected to the flexible portion 3 (Step S11: electronic component connection process), and the second sealing resin 14 is applied to the hard portion 4 (Step S12: second sealing resin application process).

Figure 6B:
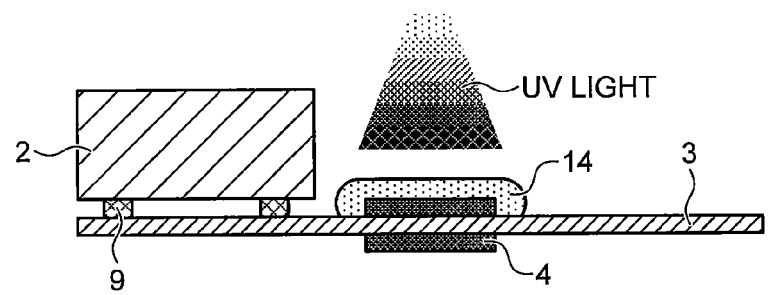

After the application of the second sealing resin 14, as illustrated in FIG. 6B, the second sealing resin 14 is irradiated with UV light to enter into a half-cured state (Step S13: UV light irradiation process). Since the second sealing resin 14 is in a half-cured state, the second sealing resin 14 can be prevented from being mixed with the first sealing resin in the following application process.

Figure 6C:
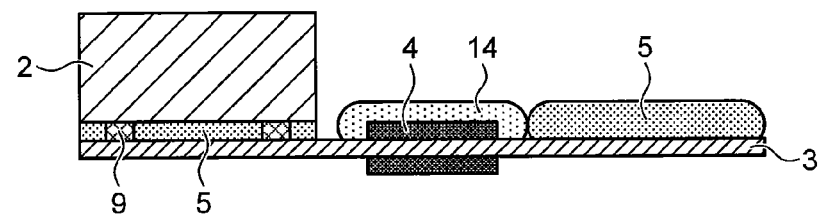
Figure 6D:
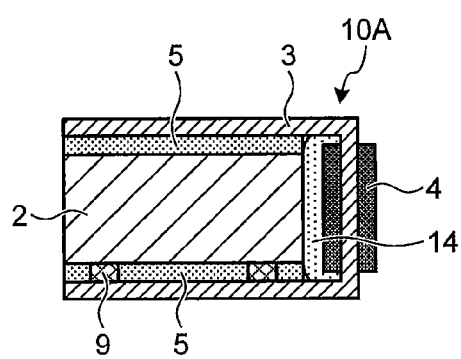

After the UV light irradiation process, as illustrated in FIG. 6C, the first sealing resin 5 is applied to the flexible portion 3 and to the lower portion of the electronic component 2 (Step S14: application process). Then, as illustrated in FIG. 6D, the flexible portion 3 is bent along the shape of the electronic component 2 and the shape of the first semiconductor device 10A is preliminarily fixed with a jig or the like (Step S15: bending process). Next, heating treatment is performed in a furnace to cure the first sealing resin 5 and the second sealing resin 14 (Step S16: curing process).

Next, the first semiconductor device 10A is provided vertical to the second semiconductor device 20 such that the hard portion 4 is parallel to the second semiconductor device 20, and the first semiconductor device 10A is connected to the second semiconductor device 20, so that the semiconductor-device mounting structure 200 is manufactured (Step S17: connection process).

According to the semiconductor-device mounting structure 200 of the second embodiment, since the soft second sealing resin 14 is used to seal the gap between the bottom surface of the electronic component 2 and the hard portion 4, when an external force is exerted to the first semiconductor device 10A, stress can be absorbed by the second sealing resin 14. Therefore, it is possible to prevent destruction in connection. In addition, similarly to the first embodiment, since the hard portion 4 is provided on the side where the first semiconductor device 10A is connected to the second semiconductor device 20, even when the flexible board 1 is bent along the shape of the electronic component 2, the flexible board 1 is not formed in an arc shape, and thus it is possible to prevent defective connection. In addition, since the first semiconductor device 10A is vertically connected to the second semiconductor device 20, it is possible to improve the packaging density.

In the second embodiment, by using a soft material as the second sealing resin 14 and using a UV-curable thermosetting resin, the mixing of the sealing resin 5 and the second sealing resin 14 can be prevented. The first sealing resin 5 may be a UV-curable thermosetting resin. In this case, the first sealing resin 5 may be applied to the flexible portion 3, the resin may be irradiated with UV light to enter into a B-stage state, and the second sealing resin 14 may be applied to the hard portion 4, so that the same effect can be obtained.

Figure 7:
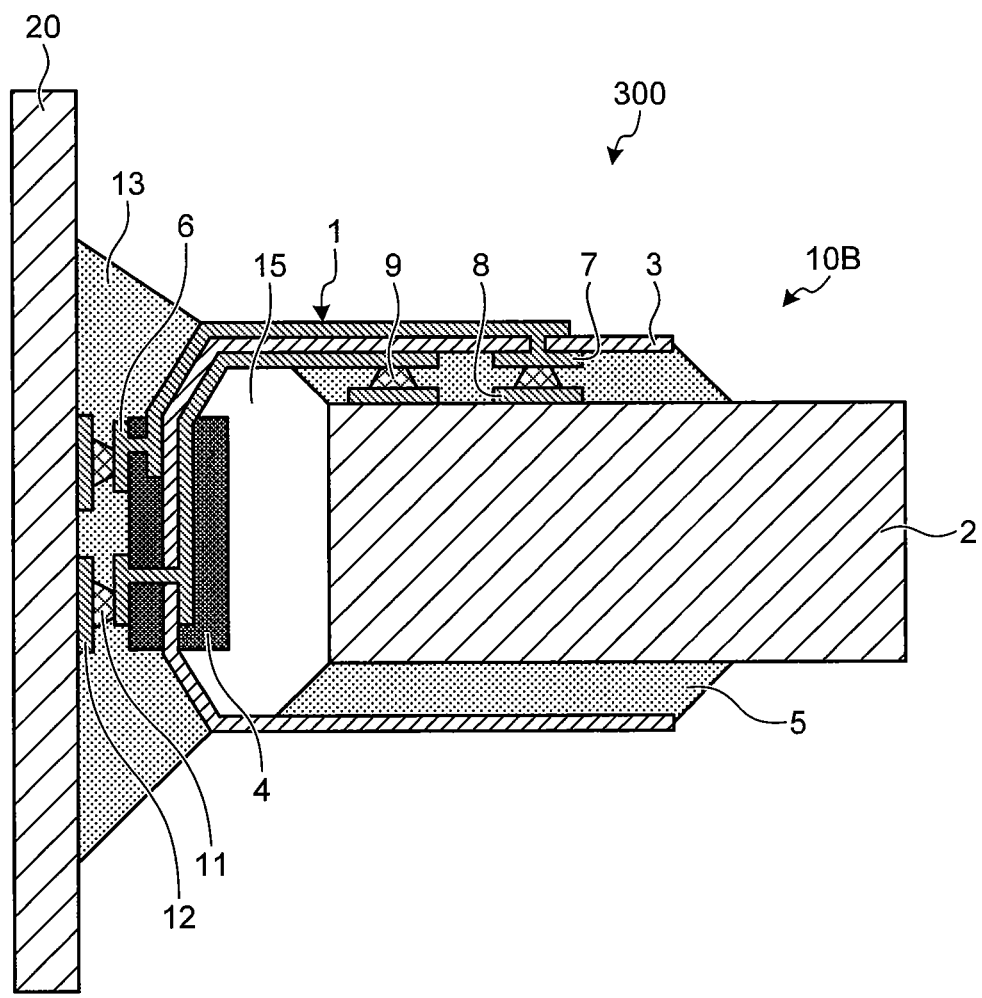
FIG. 7 is a schematic cross-sectional view of a semiconductor-device mounting structure according to a third embodiment of the present invention.

A semiconductor-device mounting structure according to a third embodiment is different from the semiconductor-device mounting structure 100 according to the first embodiment in that an air gap is formed between a bottom surface of an electronic component and a hard portion. The semiconductor-device mounting structure according to the third embodiment will be described with reference to FIG. 7. FIG. 7 is a cross-sectional view illustrating the semiconductor-device mounting structure according to the third embodiment of the present invention.

As illustrated in FIG. 7, a first semiconductor device 10B includes an air gap 15 between a bottom surface of an electronic component 2 and a hard portion 4. A sealing resin 5 is configured to seal a gap between a side surface of the electronic component 2 and a flexible portion 3.

In a semiconductor-device mounting structure 300 according to the third embodiment, due to the air gap 15, when an external force is exerted to the first semiconductor device 10B, since the flexible portion 3 in the vicinity of the air gap 15 is deformed to absorb stress, it is possible to prevent the first semiconductor device 10B from being detached from a second semiconductor device 20. In addition, similarly to the first embodiment, since the hard portion 4 is provided in the first semiconductor device 10B on the side where the second semiconductor device 20 is connected, even when the flexible board 1 is bent along the shape of the electronic component 2, the flexible board 1 is not formed in an arc shape, and it is possible to prevent defective connection. In addition, since the first semiconductor device 10B is vertically connected to the second semiconductor device 20, it is possible to improve packaging density.

In the above described second embodiment, when the temperature of the mounting structure is changed after assembling the semiconductor-device mounting structure, and if the thermal expansion coefficient of the first sealing resin is different from that of the second sealing resin, thermal stress is generated in the vicinity of the boundary between the first sealing resin and the second sealing resin and thus destruction such as peeling of resin may occur. However, in the third embodiment, it is possible to prevent the thermal stress from being generated by providing the air gap 15 instead of the second sealing resin.

Figure 8:
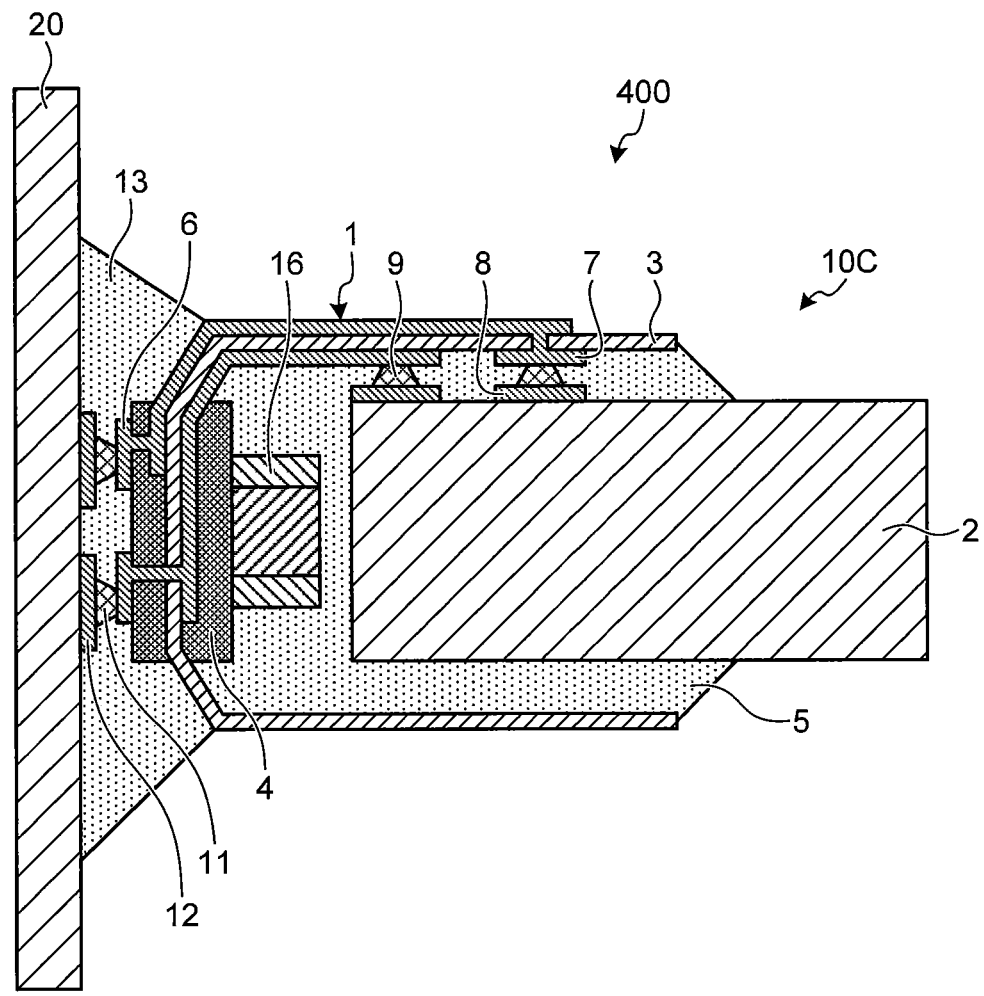
FIG. 8 is a schematic cross-sectional view of a semiconductor-device mounting structure according to a fourth embodiment of the present invention.

A semiconductor-device mounting structure according to a fourth embodiment is different from the semiconductor-device mounting structure 100 according to the first embodiment in that a second electronic component is mounted on a hard portion. The semiconductor-device mounting structure according to the fourth embodiment will be described with reference to FIG. 8. FIG. 8 is a cross-sectional view illustrating the semiconductor-device mounting structure according to the fourth embodiment of the present invention.

As illustrated in FIG. 8, in a semiconductor-device mounting structure 400 according to the fourth embodiment, a second electronic component 16 is mounted on a hard portion 4. The second electronic component 16 is a chip passive part, a package part, a semiconductor chip, or the like.

Next, a manufacturing process of the semiconductor-device mounting structure 400 according to the fourth embodiment will be described with reference to the drawings. FIGS. 9A to 9D are schematic views for describing a manufacturing process of the semiconductor-device mounting structure 400 according to the fourth embodiment of the present invention. In FIGS. 9A to 9D, electrodes are not illustrated.

Figure 9A:
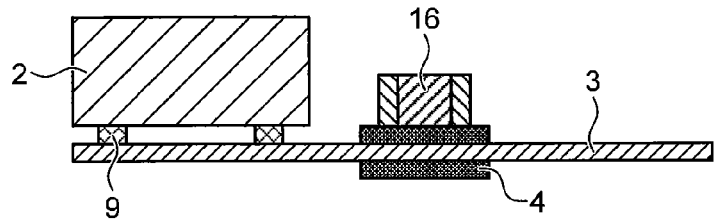
FIGS. 9A to 9D are schematic views for describing a manufacturing process of the semiconductor-device mounting structure according to the fourth embodiment of the present invention.

First, as illustrated in FIG. 9A, an electronic component 2 is connected to a flexible portion 3, and the second electronic component 16 is connected to the hard portion 4.

Figure 9B:
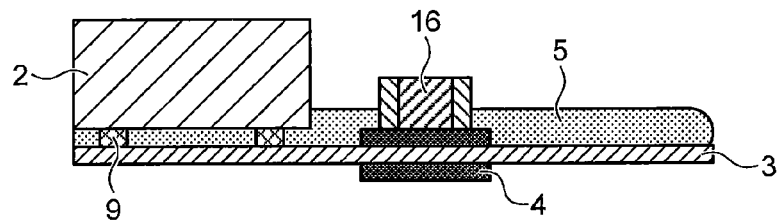
Figure 9C:
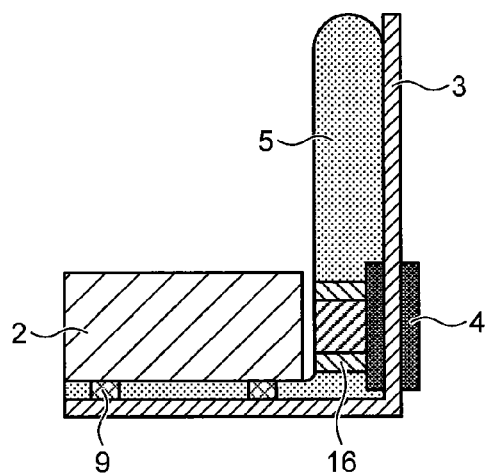
Figure 9D:
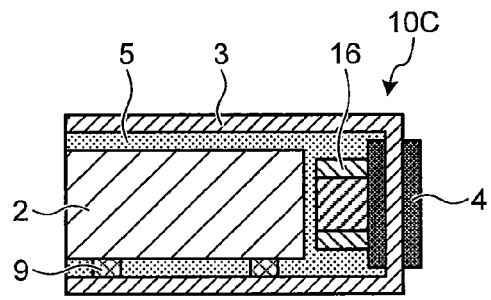

After the connection, as illustrated in FIG. 9B, a sealing resin 5 is applied to the entire surface of the flexible board 1. Next, as illustrated in FIG. 9C, the flexible portion 3 is bent, and the electronic component 2 and the second electronic component 16 are covered with the flexible board 1, as illustrated in FIG. 9D.

Next, a first semiconductor device 10C is heated to cure the sealing resin 5. The first semiconductor device 10C is vertically mounted so that the hard portion 4 is parallel to the second semiconductor device 20, and the first semiconductor device 10C is connected to the second semiconductor device 20, so that the semiconductor-device mounting structure 400 is manufactured.

In the semiconductor-device mounting structure 400 according to the fourth embodiment, since the second electronic component 16 can be mounted between the electronic component 2 and the hard portion 4, it is possible to further improve packaging density. In addition, similarly to the first embodiment, since the hard portion 4 is provided in the first semiconductor device 100 on the side where the second semiconductor device 20 is connected, even when the flexible board 1 is bent along the shape of the electronic component 2, the flexible board 1 is not formed in an arc shape, and it is possible to prevent defective connection.

Figure 10:
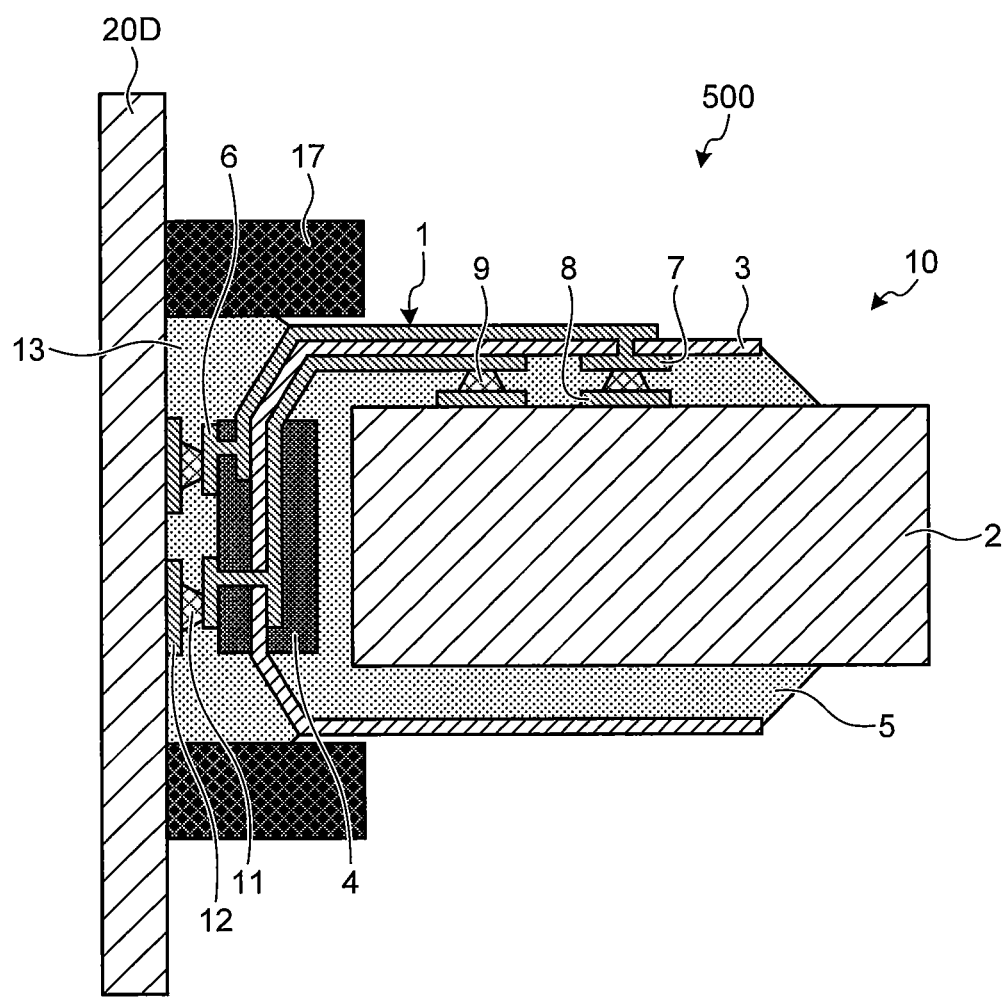
FIG. 10 is a schematic cross-sectional view of a semiconductor-device mounting structure according to a fifth embodiment of the present invention.

A semiconductor-device mounting structure according to a fifth embodiment is different from the semiconductor-device mounting structure 100 according to the first embodiment in that a position regulating member is provided on a second semiconductor device in the vicinity of a mounting position of a first semiconductor device to regulate a mounting position of a first semiconductor device. The semiconductor-device mounting structure according to the fifth embodiment will be described with reference to FIG. 10. FIG. 10 is a cross-sectional view of the semiconductor-device mounting structure according to the fifth embodiment of the present invention.

As illustrated in FIG. 10, a second semiconductor device 20D according to the fifth embodiment includes a dam 17 as a position regulating member which regulates a mounting position of the first semiconductor device 10 in the vicinity of the mounting position of the first semiconductor device 10. The first semiconductor device 10 is fit into the dam 17, so that the mounting position of the first semiconductor device 10 is regulated. The dam 17 may be formed by using a thick film metal or a thick film resin such as photoresist.

Next, a manufacturing process of a semiconductor-device mounting structure 500 according to the fifth embodiment will be described with reference to the drawings. FIGS. 11A to 11D are schematic views for describing a manufacturing process of the semiconductor-device mounting structure 500 according to the fifth embodiment of the present invention. In FIGS. 11A to 11D, electrodes are not illustrated.

Figure 11A:
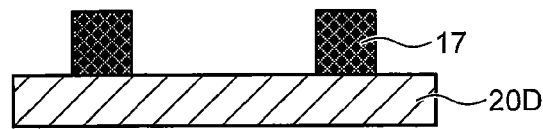
FIGS. 11A to 11D are schematic views for describing a manufacturing process of the semiconductor-device mounting structure according to the fifth embodiment of the present invention.
Figure 11B:
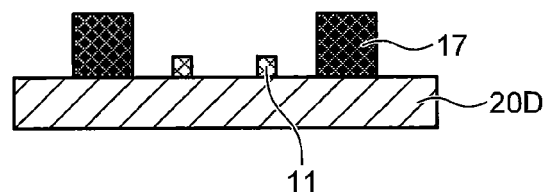
Figure 11C:
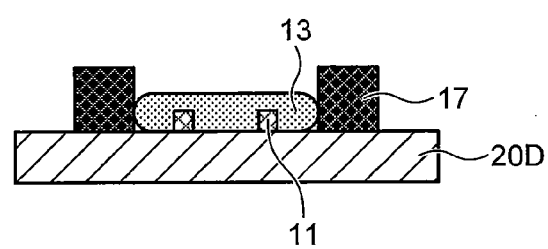
Figure 11D:
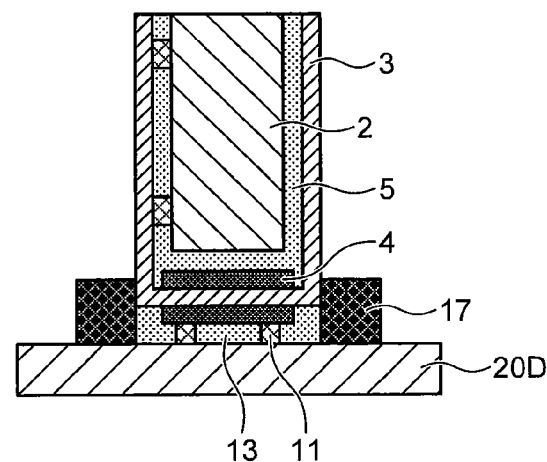

As illustrated in FIG. 11A, the dam 17 is formed at the mounting position of the first semiconductor device 10, and then, as illustrated in FIG. 11B, a conductive member 11 is formed on an electrode. Next, as illustrated in FIG. 11C, a sealing resin 13 is applied to an inner portion of the dam 17 on the second semiconductor device 20D. The first semiconductor device 10 which is manufactured through the same processes as Steps S1 to S4 of the first embodiment is mounted vertical to the second semiconductor device 20D and connected to the second semiconductor device 20D such that the hard portion 4 is parallel to the second semiconductor device 20D and the first semiconductor device 10 is fit into the dam 17, so that the semiconductor-device mounting structure 500 is manufactured as illustrated in FIG. 11D.

According to the semiconductor-device mounting structure 500 of the fifth embodiment, since the mounting position of the first semiconductor device 10 can be regulated by the dam 17, the position can easily be aligned, so that the semiconductor-device connection structure can be manufactured more easily.

In addition, the dam 17 is made of a conductive material such as metal and may serve as a part of a signal line and a ground pattern by bringing the dam into contact with a signal line or a ground pattern of the first semiconductor device and a signal line or ground pattern of the second semiconductor device, or by the electrical conduction through the conductive material. In this way, it is possible to further improve the degree of the freedom in design of the board and electrical properties.

In addition, since the hard portion 4 is provided in the first semiconductor device 10 on the side where the second semiconductor device 20D is connected, even when the flexible board 1 is bent along the shape of the electronic component 2, the flexible board 1 is not formed in an arc shape, and it is possible to prevent defective connection. In addition, since the first semiconductor device 10 is vertically connected to the second semiconductor device 20D, it is possible to improve packaging density.

Figure 12:
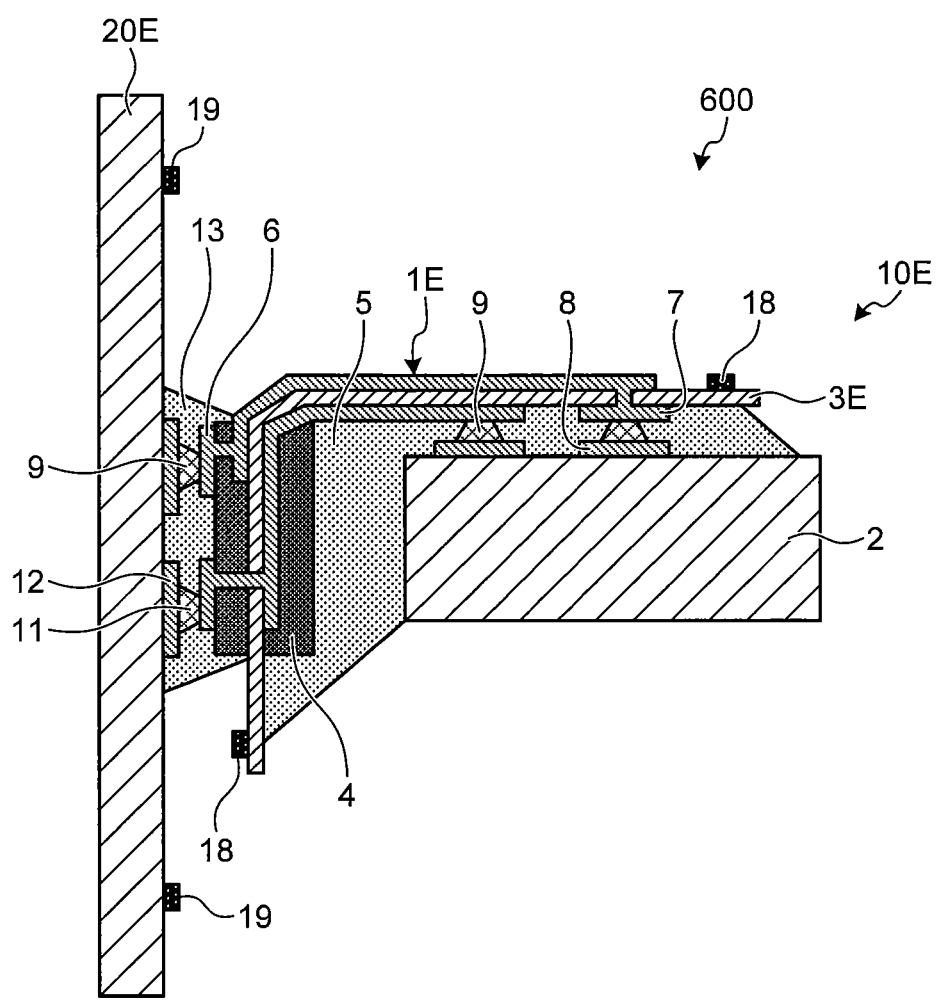
FIG. 12 is a schematic cross-sectional view of a semiconductor-device mounting structure according to a sixth embodiment of the present invention.

A semiconductor-device mounting structure according to a sixth embodiment is different from the semiconductor-device mounting structure according to the first embodiment in that alignment marks are formed in a first semiconductor device and a second semiconductor device, and after the first semiconductor device is connected to the second semiconductor device, a flexible portion is bent, so that the semiconductor-device mounting structure is manufactured. The semiconductor-device mounting structure according to the sixth embodiment will be described with reference to FIG. 12. FIG. 12 is a cross-sectional view of the semiconductor-device mounting structure according to the sixth embodiment of the present invention.

As illustrated in FIG. 12, in a first semiconductor device 10E according to the sixth embodiment, a flexible portion 3E is formed so as to be short, and a flexible board 1E is formed in an "L" shape so as to cover only one side surface and bottom surface of an electronic component 2.

On an outer surface of the flexible board 1E, an alignment mark 18 is formed opposite the electronic component 2. The alignment mark 18 is used for position alignment together with an alignment mark 19 which is formed on a second semiconductor device 20E on the side where the first semiconductor device 10E is mounted. The alignment marks 18 and 19 may be formed simultaneously during the formation of a pattern such as an electrode.

Figure 13A:
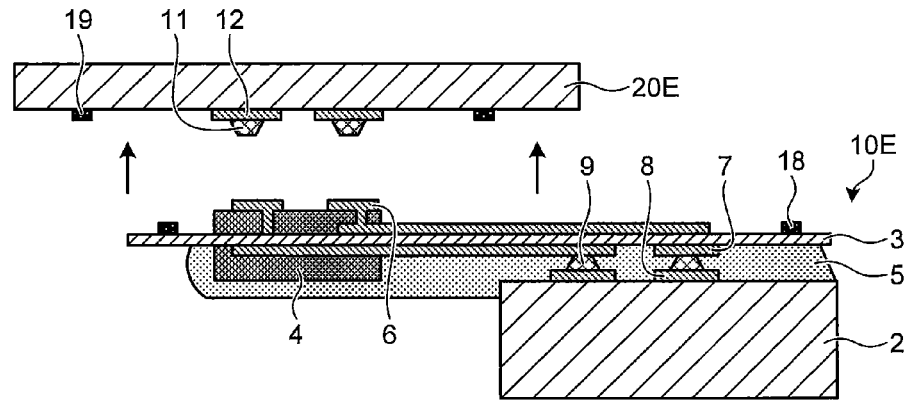
FIGS. 13A to 13C are schematic views for describing a manufacturing process of the semiconductor-device mounting structure according to the sixth embodiment of the present invention.
Figure 13B:
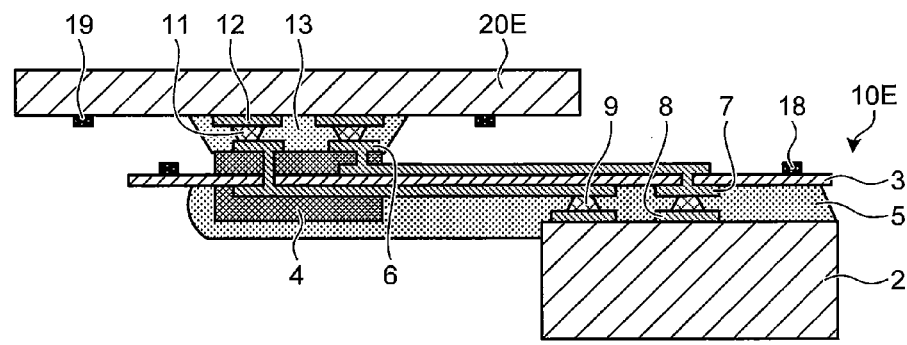
Figure 13C:
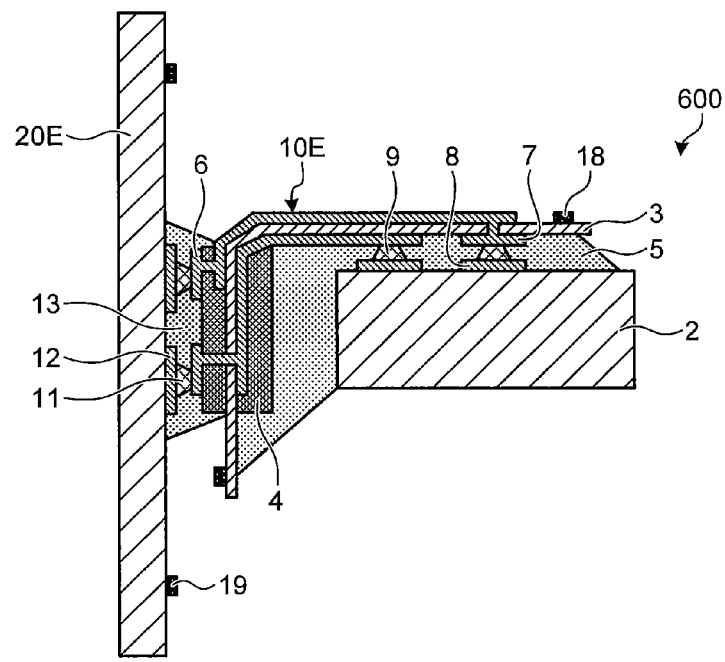

Next, a manufacturing process of the semiconductor-device mounting structure 600 according to the sixth embodiment will be described with reference to the drawings. FIGS. 13A to 13C are schematic views illustrating the manufacturing process of the semiconductor-device mounting structure 600 according to the sixth embodiment of the present invention.

As illustrated in FIG. 13A, the alignment marks 18 and 19 are observed with a camera of a mounting apparatus, the first semiconductor device 10E and the second semiconductor device 20E are aligned with each other based on the positions of the alignment marks 18 and 19 and are connected to each other. In the first semiconductor device 10E, the electronic component 2 is connected to the flexible portion 3E, and a sealing resin 5 is applied to the entire surface of the flexible board 1E. Next, the first semiconductor device 10E is connected to the second semiconductor device 20E while the flexible portion 3E is not bent.

After the connection of the first semiconductor device 10E and the second semiconductor device 20E, as illustrated in FIG. 13B, a sealing resin 13 is applied to the connection portion. Next, as illustrated in FIG. 13C, the flexible portion 3E is bent along the shape of the electronic component 2, and heating treatment is performed to cure the sealing resins 5 and 13 and to seal while the flexible portion 3E is bent, so that the semiconductor-device mounting structure 600 can be manufactured. The sealing resin 13 may be applied before the first semiconductor device 10E is connected to the second semiconductor device 20E.

According to the semiconductor-device mounting structure 600 of to the sixth embodiment, it is possible to perform position alignment of the first semiconductor device 10E and the second semiconductor device 20E by using the alignment marks 18 and 19. In addition, since the first semiconductor device 10E is vertically connected to the second semiconductor device 20E, it is possible to improve packaging density.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor-device mounting structure comprising:
 a first semiconductor device including a flexible board, an electronic component, and a sealing resin; and
 a plate-shaped second semiconductor device connected to the first semiconductor device,
 wherein the flexible board includes a bendable flexible portion and a hard portion,
 the flexible portion is bent at a boundary with the hard portion, along a shape of the electronic component such that the flexible board covers the electronic component,
 the flexible board and the electronic component are sealed with the sealing resin,
 the first semiconductor device is mounted vertical to the second semiconductor device such that the hard portion is parallel to the second semiconductor device,
 a length of the hard portion in a direction perpendicular to a bend line of the flexible portion is equal to a thickness of a bottom surface of the electronic component in the direction, an air gap is formed between the bottom surface of the electronic component and the hard portion, and the sealing resin seals a gap between a side surface of the electronic component and vicinity of the flexible portion.

2. The semiconductor-device mounting structure according to claim 1, wherein the electronic component is a rectangular body, and the bottom surface of the electronic component has an area less than other surfaces of the electronic component.

3. The semiconductor-device mounting structure according to claim 1, wherein the first semiconductor device further includes a second electronic component mounted on the hard portion.

4. A semiconductor-device mounting structure comprising:

a first semiconductor device including a flexible board, an electronic component, and a sealing resin; and a plate-shaped second semiconductor device connected to the first semiconductor device, wherein the flexible board includes a bendable flexible portion and a hard portion, the flexible portion is bent at a boundary with the hard portion, along a shape of the electronic component such that the flexible board covers the electronic component, the flexible board and the electronic component are sealed with the sealing resin, the first semiconductor device is mounted vertical to the second semiconductor device such that the hard portion is parallel to the second semiconductor device, a length of the hard portion in a direction perpendicular to a bend line of the flexible portion is equal to a thickness of a bottom surface of the electronic component in the direction, and the second semiconductor device includes a position regulating member in a vicinity of a mounting position where the first semiconductor device is mounted for regulating the mounting position of the first semiconductor device.

5. A semiconductor-device mounting structure comprising:

a first semiconductor device including a flexible board, an electronic component, and a sealing resin; and a plate-shaped second semiconductor device connected to the first semiconductor device, wherein the flexible board includes a bendable flexible portion and a hard portion, the flexible portion is bent at a boundary with the hard portion, along a shape of the electronic component such that the flexible board covers the electronic component, the flexible board and the electronic component are sealed with the sealing resin, the first semiconductor device is mounted vertical to the second semiconductor device such that the hard portion is parallel to the second semiconductor device, a length of the hard portion in a direction perpendicular to a bend line of the flexible portion is equal to a thickness of a bottom surface of the electronic component in the direction, the flexible board includes a first alignment mark on an outer surface thereof, and the second semiconductor device includes a second alignment mark on a surface thereof where the first semiconductor device is mounted.

* * * * *